United States Patent [19]

Hormadaly

[11] Patent Number: 5,439,852
[45] Date of Patent: Aug. 8, 1995

[54] CADMIUM-FREE AND LEAD-FREE THICK FILM CONDUCTOR COMPOSITION

[75] Inventor: Jacob Hormadaly, Wilmington, Del.

[73] Assignee: E. I. Du Pont de Nemours and Company, Wilmington, Del.

[21] Appl. No.: 284,021

[22] Filed: Aug. 1, 1994

[51] Int. Cl.$^6$ .................... C03C 3/062; C03C 8/18
[52] U.S. Cl. ........................ 501/26; 501/16; 501/19; 501/20; 501/21; 501/73; 501/79; 252/514; 252/518
[58] Field of Search ............ 501/16, 19, 20, 21, 501/73, 79; 252/514, 518

[56] References Cited

U.S. PATENT DOCUMENTS

| | | | |
|---|---|---|---|
| 2,278,867 | 4/1942 | Deyrup | |
| 4,282,035 | 8/1981 | Nigrin | 106/48 |
| 4,554,258 | 11/1985 | Francel | 501/26 X |
| 5,096,620 | 3/1992 | Ditz et al. | 501/79 X |
| 5,244,848 | 9/1993 | Clifford et al. | 501/26 X |
| 5,252,521 | 10/1993 | Roberts | 501/79 X |

OTHER PUBLICATIONS

Derwent Abstract for DE 4128804 A1, Mar. 1993.
Derwent Abstract for J 02204904-A, Aug. 1990.

*Primary Examiner*—Karl Group

[57] ABSTRACT

The invention is directed to a thick film paste composition comprising electrically conductive particles and finely divided particles of a glass composition comprising by mole % 5–70% $Bi_2O_3$, 18–35% $SiO_2$, 0.1–40% CuO, 0.5–25% ZnO, 0.5–40% CoO, 0.5–40% $Fe_2O_3$, and 0.5–40% MnO, which the glass composition is free of lead and cadmium, all dispersed in an organic medium.

7 Claims, No Drawings

CADMIUM-FREE AND LEAD-FREE THICK FILM CONDUCTOR COMPOSITION

FIELD OF THE INVENTION

The invention is directed to thick film paste compositions for hybrid electrical circuits and particularly to such compositions which use cadmium-free and lead-free glass frits as a binder.

BACKGROUND OF THE INVENTION

Thick film conductors serve as electrical interconnections between resistors, capacitors, and integrated circuits. Thick film conductors are used in the microcircuit industry to terminate resistor or capacitor patterns, typically by firing the conductor pattern on a substrate and then printing the resistor or capacitor pattern over part of the conductor pattern and then firing them both.

The use of gold for thick film circuit fabrication has resulted in a significant advance in microelectronics. Gold is the most malleable and ductile of all metals, properties that assist in drawing fine wire and in wire bonding. Furthermore, gold does not readily combine with oxygen. The absence of an oxygen reaction allows air firing of gold at temperatures up to its melting point. However, a well known problem with the use of gold for printing inks for thick film conductors is that it is difficult to obtain adhesion between the gold and underlying substrate. In particular, while the lack of an oxide layer on the surface of gold is advantageous when forming a bond with a metal, such as in wire bonding, it is believed to be disadvantageous for adhesive bonds with metal oxides such as glasses or ceramics.

In the present invention it is shown that the addition of copper oxide which easily reduces, results in metallic copper during the firing cycle. The copper alloys with the gold and heightens its oxygen affinity. Thus, a stronger bond is achieved with an oxidic substrate. This theory will also hold true with the substitution of copper oxide and with other easily reduceable metal oxides.

Further, most existing gold thick film compositions contain cadmium compounds as essential ingredients. Empirical studies have established that cadmium compounds such as CdO and glasses containing CdO are essential for the strong adhesion of thick film gold compositions to ceramic bodies. Recently, the use of cadmium containing compositions has been restricted, and in some regions it will be banned in the near future. More restrictions on the use of cadmium containing compounds are expected because of their high health hazards.

Nontoxic lead-free and cadmium-free frit systems which are low melting, moderate in expansion and durability that provide excellent wetting are not, however, known in the art. Therefore, consistent with efforts to reduce or eliminate lead and cadmium from broad catagories of products containing glass frits, the present invention deals with a lead-free and cadmium-free glass frit that has been shown to be useful in the formulation of thick film paste compositions. The composition of the present invention renders a nontoxic, cadmium-free/lead-free thick film alternative to presently used compositions.

SUMMARY OF THE INVENTION

In one aspect, the invention is directed to a glass composition comprising by mole % 5-70% $Bi_2O_3$, 18-35% $SiO_2$, 0.1-40% CuO, 0.5-25% ZnO, 0.5-40% CoO, 0.5-40% $Fe_2O_3$ and 0.5-40% MnO, which is free from lead and cadmium.

In a second aspect, the invention is directed to a screen printable thick film paste composition suitable for thick film conductor application comprising a dispersion of finely divided particles of a blend of the above described glass composition and a second glass comprising by mole % by mole % (1) 65-85% glass-forming oxides containing 25-55% $B_2O_3$, 40-10% $SiO_2$ and 30-0% other glass forming oxides selected from $Al_2O_3$, $Bi_2O_3$, $ZrO_2$ and mixtures thereof, and (2) 35-15% glass modifying oxides consisting essentially of 3-35% alkaline earth metal oxide(s) of which no more than about 10% is MgO and 0-28% replacement oxide(s) selected from the group consisting of CuO, $Cu_2O$, PbO, ZnO and mixtures thereof, of which none exceeds 10% and the total of which does not exceed 80% of the total glass modifying oxides, which the second glass composition is free of lead and cadmium.

In a third aspect, the invention is directed to a glass compositon comprising by mole % 0.5-2% MgO, 0-20% BaO, 0-6% $Al_2O_3$, 0-45% $B_2O_3$, 0-5% $ZrO_2$, 18-35% $SiO_2$, 5-70% $Bi_2O_3$, 0-25 ZnO, 0.2-40% CuO, 0.1-40% CoO, 0.5-40% $Fe_2O_3$ and 0-40% MnO, which the glass composition is free of lead and cadmium.

In a fouth aspect, the invention is directed to a screen printable thick film paste composition suitable for thick film conductor application comprising a dispersion of finely divided particles of the above described glass composition(s) and electrically conductive particles.

In a fifth aspect, the invention is directed to the above thick film paste compositions further comprising copper oxide selected from the formula $CuO_x$ where x ranges from 0-1.

In this Summary of the Invention, as well as the Detailed Description of the Invention which follows, all percentages are on a molar basis relative to the total glass composition unless otherwise indicated.

DETAILED DESCRIPTION OF THE INVENTION

It was found that conductor paste ingredients such as $CuO_x$, where x is 0-1, and $Bi_2O_3$ partially reduce to the corresponding metals during the firing process. The metals Cu and Bi then alloy with the gold, thus modifying its surface characteristics and mechanical properties. It is believed that these elements, which are more electropositive than gold, form the strong chemical bonds at the surface of the gold film with the ceramic dielectrics. In other words, alloyed Bi and Cu with gold render the gold surface at the gold-ceramic interface, more reactive toward the oxidic sites in the ceramic bodies. Stronger bonds are manifested in an improved adhesion of the gold film to the ceramic and improved wire bonding strength. The increased reactivity is believed to be the key for enhanced adhesion and better wire bonding performance of gold compositions. Outstanding 1 mil Au wire bonding were demonstrated for gold compositions containing the bismuthate glasses as a sole inorganic binder. However, it was found that a glass by itself is not sufficient for 2 mil Au wire bonding. Therefore, this invention also addresses a blend of glasses with an optional addition of copper or copper oxide which yields an acceptable composition for Au 2 mil wire bonding and aluminum wire bonding.

A. INORGANIC BINDER

A key constituent in the formulation is finely divided particles of an inorganic glass frit. The frit is required for bonding sintered metal powders, thus the softening point and viscosity of the frit during firing, as well as its wetting characteristics for the metal powder and the substrate are critical. The particle size of the frit is not narrowly critical and frits useful in the present invention will typically have an average particle size from about 0.5 to 4.5 microns, preferably from about 1 to about 3 microns. The amount of binder will typically be from about 1 to 20% by weight of the conductor composition (excluding the organic medium), preferably about 1 to 10% by weight, and more preferably about 1 to 6% by weight. Wetting of a solid surface by a liquid is defined in a general sense in terms of a contact angle formed between liquid-solid interface and a tangent to the surface of the liquid at the contact point. The smaller the contact angle, the better the wetting that is exhibited and the less glass that is required to completely wet a given surface area of solid. A preferred firing temperature is between 600° to 1000° C.

Minimization of stress between a thick-film conductor and a substrate is dependent upon their thermal expansion properties, respective moduli of elasticity and relative thickness. The metals, the higher primary constituent of the conductor compositions, have a higher TCE but also has a substantially lower modulus compared to glass. To take advantage of the lower modulus of elasticity of metal compared to glass, it is desirable to use the lowest practical amount of glass binder in the conductor formulation, thereby minimizing the stress at the bonding interface. A glass binder which exhibits excellent wetting properties allows the formulator to minimize the amount of binder needed while maintaining excellent solderability and adhesion.

Prior art glasses for conductor compositions have been based on cadmium or lead frits. Eliminating lead and cadmium from conductor compositions to meet the current toxicity and environmental concerns limits the options for finding a glass suitable for low softening and flow properties while also meeting wettability, thermal expansion and performance requirements. The current invention deals with the unexpected outstanding performance of a series of glasses based upon the constituents: $Bi_2O_3$, $SiO_2$, $CuO$, $ZnO$, $CoO$, $Fe_2O_3$ and $MnO$.

Compositionally, the above glass may be blended with a second glass, glasses for use in the invention as a second glass are borosilicate glasses which contain by mole % 65-85% glass-forming oxides and 35-15% glass-modifying oxides.

The primary glass-forming oxides are $B_2O_3$ which is used at a concentration of 25-55% of the glass and $SiO_2$ which is used at a concentration of 40 to 10% of the glass. The glass should contain at least 25% $B_2O_3$ to ensure that the viscosity of the glass during firing is not excessively high. However, if the $B_2O_3$ content is higher than about 55%, the durability of the glass is likely to be reduced to unacceptable levels.

The glass may also contain conditional glass-forming oxides up to a concentration of 30%. Such conditional glass-forming oxides include $Al_2O_3$, $Bi_2O_3$, $ZrO_2$ and mixtures thereof. While these conditional glass-forming oxides are not considered essential for all applications of the invention, it is nevertheless preferred that the glass contain at least about 10% and preferably 15% of such secondary glass-forming oxides. In particular, $Bi_2O_3$ is desirable to lower viscosity of the glass and enhance the glass firing range. On the other hand, $Al_2O_3$ is desirable not only to enhance the glass-forming range, but also improve its durability.

The primary glass modifiers for use in the second glasses of the invention are the alkaline earth metal oxides which can be used in amounts up to 35% of the total glass. The alkaline earth metal oxides can be used either individually or in admixture. However, it is preferred that no more than 10% MgO be used, lest the glass tend to crystallize when it is subjected to thick film processing conditions. Up to 80% of the primary alkaline earth metal oxide glass modifiers can be substituted by secondary or substitute glass modifiers such as ZnO, PbO, $Cu_xO$ ($Cu_2O$ or CuO) or $ZrO_2$. However, the glass binder should contain no more than 15% wt. of any of these substitute glass formers, lest the viscosity of the glass at firing temperature become too high.

The invention is not limited to the above descriptions. It may further be extended to a single cadmium-free and lead-free glass with ranges obtained from blending two or more glasses of Examples 1-10 from Table I with Example 11 of the Table to obtain compositional ranges as disclosed. Furthermore, the compositional ranges of this invention may, also, be obtained by mixing two or more suitable glasses or by making one glass or by mixing glasses with appropriate crystalline phases.

B. ELECTRICALLY FUNCTIONAL MATERIALS

Metal particles such as copper, gold, silver, platinum, palladium, or mixtures and alloys thereof, can be used in the practice of this invention. The preferred metal particle is gold. The particle size of the metal powder or flake is not by itself narrowly critical from the standpoint of technical effectiveness. However, particle size does affect the sintering characteristics of the metal in that large particles sinter at a lower rate than small particles. Blends of powders and/or flakes of differing size can be used to tailor the sintering characteristics of the conductor formulation during firing, as is well known in the art. The metal particles must, however, be of a size appropriate to the method of application, which is usually screen printing. The metal particles should, therefore, be no larger than 20 microns in size and preferably no larger than 10 microns. The minimum particle size is normally about 0.1 micron. The amount of gold in the composition will usually be from 60-90% wt. on a paste basis and 70-99% wt. upon firing.

COPPER ADDITIVE

The copper additive component of the invention can be represented by the formula $CuO_x$ wherein x is the range of 0-1. The copper particles should be no larger than 20 microns in size and preferably within the range of 0.1-10 microns.

The copper additive can be added in a particulate form simply by admixing it with other solids. The copper additive behaves in a different manner than the copper oxide found in the glasses of the present invention. The amount of $CuO_x$ in the composition will usually be from 0.01-1% wt. on a paste basis and 0.02-1.5% wt. upon firing.

D. ORGANIC MEDIUM

Finely divided particles of electrically functional material and inorganic binder will ordinarily be dispersed in an organic medium to form a semi-fluid paste which is capable of being printed in a desired circuit pattern. The organic medium can be any suitably inert liquid, nonaqueous inert liquids being preferred, which provides appropriate wettability of the solids and the substrate, a relatively stable dispersion of particles in the paste, good printing performance with acceptable screenlife, dried film strength sufficient to withstand rough handling, and good firing properties. Any one of various organic liquids with or without thickening agents, stabilizing agents and/or other common additive can be used. Exemplary of the organic liquids which can be used are alcohols, esters of such alcohols such as the acetates and propionates; terpenes such as pine oil, terpineol, and the like; and solutions of resins such as polymethacrylates, polyvinylpyrrolidone or ethyl cellulose in solvents such as pine oil and monobutyl ether of diethylene glycol monoacetate. The medium can also contain volatile liquids to promote fast setting after printing to the substrate. The organic medium will ordinarily constitute 5–50% wt. of the paste.

The conductive paste compositions are conveniently prepared on a three-roll mill. A preferred viscosity for these compositions is approximately 50–350 Pa.S measured on a Brookfield HBT viscometer using a #14 spindle at 10 rpm and 25° C. The amount of thickener utilized is determined by the final desired formulation viscosity which, in turn, is determined by the printing requirements of the system.

TEST PROCEDURES

Wire Bonding

Wire bonding is conventionally achieved by bringing the wire into intimate contact with the metallization, followed by application of ultrasound and/or thermal energy to form a bond between the wire and the metallization. More specifically, the technique used in the present invention is to form a wire loop between two pads and insert a claw attached to a tensile quage beneath the loop and measure the force required to break the bond or wire. The breaking force measured will be a function of the pitch between the bonds and loop size, also the rate of pull will affect the value of breaking force attained.

The following examples further illustrate but do not limit the present invention.

GLASS PREPARATION

The preparation of such glass frits is well-known and consists, for example, melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid; silicon dioxide will be produced from flint; barium oxide will be produced from barium carbonate; etc. The glass is preferably milled in a ball mill with water to reduce the particle size of the frit and to obtain a frit of substantially uniform size. The glasses are prepared by convention glass-making techniques by mixing the desired components in the desired proportions and heating the mixture to form a melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at a peak temperature of 1100°–1400° C. for a period of 1–1½ hours. The melt is then poured into cold water. The maximum temperature of the water during quenching is kept as low as possible by increasing the volume of water to melt ratio. The crude frit after separation from water is freed from residual water by drying in air or by displacing the water by rinsing with methanol. The crude frit is then ball milled for 3–15 hours in alumina containers using alumina balls. Alumina picked up by the materials, if any, is not within the observable limit as measured by X-ray diffraction analysis. After discharging the milled frit slurry from the mill, excess solvent is removed by decantation and the frit powder is air-dried at room temperature. The dried powder is then screened through a 325 mesh screen to remove any large particles.

The major two properties of the frit are that it aids the liquid phase sintering of the inorganic crystalline particulate materials and forms noncrystalline (amorphous) or crystalline materials by devitrification during the heating-cooling cycle (firing cycle) in the preparation of thick film compositions. This devitrification process can yield either a single crystalline phase having the same composition as the precursor noncrystalline (glassy) material or multiple crystalline phases with different compositions from that of the precursor glass material.

COMPOSITION PREPARATION

In the preparation of the composition of the present invention, the particulate inorganic solids are mixed with the organic carrier and dispersed with suitable equipment, such as a three-roll mill, to form a suspension, resulting in a composition for which the viscosity will be in the range of about 100–150 pascal-seconds at a shear rate of 4 sec$^{-1}$.

In the examples which follow, the formulation was carried out in the following manner:

The ingredients of the paste, minus about 5% organic components equivalent to about 5% wt., are weighted together in a container. The components are then vigorously mixed to form a uniform blend; then the blend is passed through dispersing equipment, such as a three-roll mill, to achieve a good dispersion of particles. A Hegman gauge is used to determine the state of dispersion of the particles in the paste. This instrument consists of a channel in a block of steel that is 25 μm deep (1 mil) on one end and ramps up to 0″ depth at the other end. A blade is used to draw down paste along the length of the channel. Scratches will appear in the channel where the agglomerates' diameter is greater than the channel depth. A satisfactory dispersion will give a fourth scratch point of 10–18 typically. The point at which half of the channel is uncovered with a well dispersed paste is between 3 and 8 typically. Fourth scratch measurement of >10 μm indicate a poorly dispersed suspension.

The remaining 5% consisting of organic components of the paste is then added, and the resin content is adjusted to bring the viscosity when fully formulated to between 140 to 200 Pa.s at a shear rate of 4 sec$^{-1}$. The composition is then applied to a substrate, such as alumina ceramic, usually by the process of screen printing, to a wet thickness of about 30–80 microns, preferably 35–70 microns, and most preferably 40–50 microns. The electrode compositions of this invention can be printed onto the substrates either by using an automatic printer or a hand printer in the convention manner, preferably automatic screen stencil techniques are employed using a 200- to 325-mesh screen. The printed pattern is then dried at below 200° C., about 150° C., for about 5-15 minutes before firing. Firing to effect sintering of both the inorganic binder and the finely divided particles of metal is preferably done in a well ventilated belt conveyor furnace with a temperature profile that will allow burnout of the organic matter at about 300°-600° C., a period of maximum temperature of about 700°-1000° C. lasting about 5-15 minutes, followed by a controlled cooldown cycle to prevent over sintering, unwanted chemical reactions at intermediate temperatures or substrate fracture which can occur from too rapid cooldown. The overall firing procedure will preferably extend over a period of about 1 hour, with 20-25 minutes to reach the firing temperature, about 10 minutes at the firing temperature and about 20-25 minutes in cooldown. In some instances, total cycle times as short as 30 minutes can be used.

EXAMPLES

EXAMPLES 1-11

Ten glasses were prepared by the above method, milled, and characterized by X-ray Diffraction (XRD) and Differential Thermal Analysis (DTA). The glass transition temperature (Tg) as obtained from DTA and dilatometric measurement were in the range of 3000°-550° C. and preferably 350°-500° C. 10 glasses in accordance with the invention are given in Table I. Example 11 is a commercially available product made by E. I. du Pont de Nemours and Co., Wilmington, Del.

Compositions in mole % are given in Table I along with a commercially available Cd & Pb free glass (Example XI). All the experimental glasses contain 30.0 mole % of $SiO_2$, the other 70 mole % consists of $Bi_2O_3$ as such (glass II in table 1) or a combination of transition metal oxides and $Bi_2O_3$. The $Bi_2O_3$-$SiO_2$ system is a very powerful solvent for transition metal oxides; at fixed $SiO_2$ concentration of 30 mole % these glasses can dissolve substantial amounts of transition metal oxides.

TABLE I

| Glass compositions in mole % | | | | | | | | | | | |
|---|---|---|---|---|---|---|---|---|---|---|---|
| | Example No. | | | | | | | | | | |
| | 1 | 2 | 3 | 4 | 5 | 6 | 7 | 8 | 9 | 10 | 11 |
| BaO | — | — | — | — | — | — | — | — | — | — | 17.22 |
| MgO | — | — | — | — | — | — | — | — | — | — | 2.00 |
| ZnO | 10.0 | — | — | 20.0 | — | — | — | — | — | — | 6.70 |
| CuO | 20.0 | — | 40.0 | — | — | — | — | — | — | — | 0.50 |
| CoO | 5.0 | — | — | — | 20.0 | 40.0 | — | — | — | — | — |
| MnO | — | — | — | — | — | — | 20.0 | 40.0 | — | — | — |
| $Fe_2O_3$ | — | — | — | — | — | — | — | — | 20.0 | 40.0 | — |
| $Al_2O_3$ | — | — | — | — | — | — | — | — | — | — | 4.30 |
| $B_2O_3$ | — | — | — | — | — | — | — | — | — | — | 42.35 |
| $Bi_2O_3$ | 35.0 | 70.0 | 30.0 | 50.0 | 50.0 | 30.0 | 50.0 | 30.0 | 50.0 | 30.0 | 5.00 |
| $SiO_2$ | 30.0 | 30.0 | 30.0 | 30.0 | 30.0 | 30.0 | 30.0 | 30.0 | 30.0 | 30.0 | 17.40 |
| $ZrO_2$ | — | — | — | — | — | — | — | — | — | — | — |

In the Examples which follow, all thick film compositions were prepared in the manner described hereinabove.

EXAMPLES 12-15

A series of 4 Au compositions, using glasses 1 & 2 of Table I were made on the roll mill (100 g scale) for 1 mil Au wire bonding evaluation. Compositions are given in Table II.

TABLE II

| Au compositions in wt % | | | | |
|---|---|---|---|---|
| | Example No. | | | |
| | 12 | 13 | 14 | 15 |
| Au | 83.00 | 83.00 | 83.00 | 83.00 |
| Example 1 | 1.00 | 3.00 | — | — |
| Example 2 | — | — | 1.00 | 3.00 |
| $Bi_2O_3$ | — | — | — | — |
| CdO | — | — | — | — |
| $Cu_2O$ | — | — | — | — |
| organic vehicle* | to 100% | to 100% | to 100% | to 100% |

*organic vehicle

Example 12 to 15 compositions were printed on $Al_2O_3$, dielectric 5704 and dielectric QM42 substrates, using gold bonding pattern-screen 325 mesh. One mil wire bonding were measured for single and multiple (5 firings) firing on all the above-mentioned dielectric. Condensed data of pull strengths are illustrated in Table III.

**Dielectric 5704 and dielectric QM42 substrates are commercially available thick film dielectrics sold by E. I. du Pont de Nemours and Co., Wilmington, Del.

TABLE III

| | 1 Mil Wire Pull Strengths | | | | |
|---|---|---|---|---|---|
| | Sub/ Firings | AVG (g) | SIG (%) | (AVG-3SIG (g)) | Min (g) |
| Example 12 | $Al_2O_3$/1 | 11.7 | 10.5 | 8.0 | 8.0 |
| " | $Al_2O_3$/5 | 11.8 | 21.7 | 7.3 | 6.0 |
| " | 5704/1 | 11.5 | 10.4 | 7.9 | 7.0 |
| " | 5704/5 | 11.4 | 11.6 | 7.4 | 4.5 |
| " | QM43/1 | 11.3 | 15.0 | 6.2 | 5.5 |
| " | QM42/5 | 11.3 | 13.8 | 6.6 | 5.0 |
| Example 13 | $Al_2O_3$/1 | 11.6 | 9.9 | 8.1 | 9.0 |
| " | $Al_2/O_3$/5 | 11.8 | 11.9 | 7.6 | 8.5 |
| " | 5704/1 | 11.1 | 10.9 | 7.4 | 7.5 |
| " | 5704/5 | 11.5 | 11.7 | 7.5 | 8.5 |
| " | QM42/1 | 11.4 | 12.6 | 7.1 | 6.5 |
| " | QM42/5 | 11.5 | 10.3 | 8.0 | 8.5 |
| Example 14 | $Al_2O_3$/1 | 11.9 | 9.6 | 8.4 | 8.5 |
| " | $Al_2O_3$/5 | 12.0 | 10.2 | 8.3 | 8.3 |
| " | 5704/1 | 11.8 | 9.7 | 8.3 | 8.5 |
| " | 5704/5 | 11.4 | 10.8 | 7.7 | 8.0 |
| " | QM42/1 | 11.8 | 10.0 | 8.2 | 8.5 |
| " | QM42/5 | 11.9 | 10.1 | 8.3 | 8.5 |
| Example 15 | $Al_2O_3$/1 | 11.7 | 9.1 | 8.5 | 9.0 |
| " | $Al_2O_3$/5 | 11.8 | 9.5 | 8.4 | 9.0 |
| " | 5704/1 | 11.8 | 10.2 | 8.2 | 9.0 |
| " | 5704/5 | 11.7 | 10.8 | 7.9 | 8.0 |
| " | QM42/1 | 11.9 | 10.5 | 8.1 | 7.5 |
| " | QM42/5 | 11.7 | 10.6 | 7.9 | 8.0 |

The number of bonds per combination (gold composition/substrate/firing) was constant at 2000. All combination (24) had zero misses. From the group of 24 combinations, only Example 15 on dielectric QM42 showed 1% metallization lifts; the remaining had acceptable failure modes. These experimental gold compositions (Table III) although not optimized still show good properties.

Not shown in the Table III, two mil wire bonding experiments were preformed for bond strengths of Examples 12–15 on various substrates, the results were very inconsistent: average pull strength varied strongly with the substrate and the standard deviations were very high. All compositions had high percentage of divots >50% for most combinations. All compositions had very high (metallization lift) failure mode. Poor performance was found for all combinations (24) in 2 mil Au wire bonding.

EXAMPLES 16–23

Table IV illustrates eight gold compositions that were made on the roll mill (50 g scale) using 2% binder consisting of 1.50% of the glasses of Examples 1–8 and 0.5% of Example 11.

The blend of glasses had outstanding 1 mil wire bonding strength. Although, two mil Au wire bonding of Examples 16–23 resulted in poor performance.

TABLE IV

| Gold compositions with cobinder (wt %) | | | | | | | | |
|---|---|---|---|---|---|---|---|---|
| | Example No. | | | | | | | |
| | 16 | 17 | 18 | 19 | 20 | 21 | 22 | 23 |
| Au | 83.0 | 83.0 | 83.0 | 83.0 | 83.0 | 83.0 | 83.0 | 83.0 |
| Example 11 | 0.5 | 0.5 | 0.5 | 0.5 | 0.5 | 0.5 | 0.5 | 0.5 |
| Example 1 | 1.5 | — | — | — | — | — | — | — |
| Example 2 | — | 1.5 | — | — | — | — | — | — |
| Example 3 | — | — | 1.5 | — | — | — | — | — |
| Example 4 | — | — | — | 1.5 | — | — | — | — |
| Example 5 | — | — | — | — | 1.5 | — | — | — |
| Example 6 | — | — | — | — | — | 1.5 | — | — |
| Example 7 | — | — | — | — | — | — | 1.5 | — |
| Example 8 | — | — | — | — | — | — | — | 1.5 |
| Organic Vehicle | to 100% → | | | | | | | |

EXAMPLES 24–37

Composition Examples 24 to 31 were made on a roll mill (50 g scale). Total inorganic binder was 2% consisting of 1.5% the glasses of Examples 1 to 8 from Table 1 and 0.5% of the cobinder of Example 11. 0.1g CuO was then added to 20g of paste. The mixtures were then dispersed on the muller.

Two mil Au wire bonding data of Examples 24 to 31 on alumina and 5704 dielectrics are collected in Table VI. Table VI shows that CuO with the Cd/Pb free glasses results in a major improvement in the 2 mil Au wire bonding performance.

The operable range of CuO is shown in Table VII and illustrated as Examples 32 to 37. Performance of Examples 32 to 37 in 2 mil Au wire bonding is given in Table VIII on alumina and 5704 dielectrics. Table VIII shows that it was difficult to form bonds to samples with high CuO concentration; 224 bonds were realized with Example 32 but only 3 bonds with Example 34. The same trend was found for Examples 35 to 37. The number of misses also increased with the increase in CuO concentration; for example, 6 misses out of 224 bond for Example 32 on alumina and 3 misses out of 3 bonds for Example 34 on alumina. Burnishing (to remove surface contamination) of fired parts of Examples 32 to 37 did not improve the wire bonding performance, the number of misses did not change. It is believed that the trends of properties of Examples 32 to 37 are due to excessive alloy formation (Cu/Au alloy); copper is known to increase the hardness of gold. Increased hardness is manifested in a higher number of misses.

TABLE V

| CuO modified compositions (wt %) | | | | | | | | |
|---|---|---|---|---|---|---|---|---|
| Ingredients | 24 | 25 | 26 | 27 | 28 | 29 | 30 | 31 |
| Au | 82.59 | 82.59 | 82.59 | 82.59 | 82.59 | 82.59 | 82.59 | 82.59 |
| Example 11 | 0.50 | 0.50 | 0.50 | 0.50 | 0.50 | 0.50 | 0.50 | 0.50 |
| CuO | 0.50 | 0.50 | 0.50 | 0.50 | 0.50 | 0.50 | 0.50 | 0.50 |
| Example 1 | 1.49 | — | — | — | — | — | — | — |
| Example 2 | — | 1.49 | — | — | — | — | — | — |
| Example 3 | — | — | 1.49 | — | — | — | — | — |
| Example 4 | — | — | — | 1.49 | — | — | — | — |
| Example 5 | — | — | — | — | 1.49 | — | — | — |
| Example 6 | — | — | — | — | — | 1.49 | — | — |
| Example 7 | — | — | — | — | — | — | 1.49 | — |
| Example 8 | — | — | — | — | — | — | — | 1.49 |
| organics | to 100% → | | | | | | | |

TABLE VI

2 Mil. Au Wire Bonding Summary

| Sample | Substrate | Bonds | Misses | FOE's | Divots | Lifts |
|---|---|---|---|---|---|---|
| 24 | Alumina | 196 | 2 | 5 | 6 | 11 |
| 24 | 5704 | 196 | 0 | 0 | 28 | 0 |
| 25 | Alumina | 196 | 0 | 0 | 62 | 3 |
| 25 | 5704 | 196 | 0 | 0 | 87 | 0 |
| 26 | Alumina | 196 | 2 | 3 | 5 | 29 |
| 26 | 5704 | 196 | 0 | 1 | 22 | 1 |
| 27 | Alumina | 196 | 0 | 0 | 85 | 0 |
| 27 | 5704 | 196 | 0 | 0 | 63 | 0 |
| 28 | Alumina | 196 | 0 | 0 | 65 | 3 |
| 28 | 5704 | 196 | 0 | 0 | 68 | 0 |
| 29 | Alumina | 196 | 0 | 1 | 72 | 0 |
| 29 | 5704 | 196 | 0 | 1 | 51 | 0 |
| 30 | Alumina | 196 | 0 | 0 | 70 | 3 |
| 30 | 5704 | 196 | 0 | 0 | 18 | 0 |
| 31 | Alumina | 196 | 0 | 0 | 12 | 4 |
| 31 | 5704 | 196 | 0 | 1 | 5 | 1 |

Bond Conditions: 090 035 090 090 035 130
1-F 1-T 1-US 2-F 2-T 2-US

F = Force in grams
T = Time in milliseconds
US = Ocillation Amplitude in microinches

TABLE VII

| Au compositions with higher CuO content (wt %) | | | | | | |
|---|---|---|---|---|---|---|
| | Example No. | | | | | |
| | 33 | 34 | 35 | 36 | 37 | 38 |
| Au | 82.50 | 82.50 | 81.50 | 82.50 | 82.00 | 81.50 |
| Example 11 | 0.50 | 0.50 | 0.50 | 0.50 | 0.50 | 0.50 |
| Cu | 0.50 | 1.00 | 1.50 | 0.50 | 1.00 | 1.50 |
| Example 4 | 1.50 | 1.50 | 1.50 | — | — | — |
| Example 6 | — | — | — | 1.50 | 1.50 | 1.50 |
| organics | to 100% | | | | | |

TABLE VIII

E78450-42-Series
2 Mil. Au Wire Bonding Summary

| Example | Substrate | Bonds | Misses | FOE's | Divots |
|---|---|---|---|---|---|
| 32 | Alumina | 224 | 6 | 1 | 0 |
| 32 | 5704 | 224 | 3 | 0 | 0 |
| 32 | Print/Dry/Print | 56 | 19 | 13 | 0 |
| 33 | Alumina | 84 | 25 | 6 | 0 |
| 33 | 5704 | 98 | 19 | 2 | 0 |
| 33 | Print/Dry/Print | 8 | 6 | 2 | 0 |
| 34 | Alumina | 3 | 3 | 3 | 0 |
| 34 | 5704 | | | | |
| 34 | Print/Dry/Print | | | | |
| 35 | Alumina | 224 | 16 | 2 | 0 |
| 35 | 5704 | 224 | 2 | 0 | 0 |
| 35 | Print/Dry/Print | 12 | 8 | 8 | 0 |
| 36 | Alumina | 224 | 57 | 14 | 0 |
| 36 | 5704 | | | | |

TABLE VIII-continued

E78450-42-Series
2 Mil. Au Wire Bonding Summary

| Example | Substrate | Bonds | Misses | FOE's | Divots |
|---------|-----------|-------|--------|-------|--------|
| 36 | Print/Dry/Print | | | | |
| 37 | Alumina | 10 | 10 | 4 | 0 |
| 37 | 5704 | | | | |
| 37 | Print/Dry/Print | | | | |

Bond Conditions: 090, 035, 090, 090, 035, 130

EXAMPLES 38–47

Examples 38–47 illustrate improved gold compositions and their performance evaluation in 2 mil Au, 1.5 & 10 mil Al wire bonding. An optimized glass binder-cobinder is used i.e., bismuth glass/Example 11 ratio of 3:1. Glass compositions Example 4 (zinc glass), Example 6 (cobalt glass 40 mole% CoO), Example (Cobalt glass 20 mole% CoO) and Example 9 (Iron glass mole % $Fe_2O_3$) are used with additives such as CuO & Cu.

Compositions illustrating optimized formulation with Cu, CuO & Ag are collected in Table IX. Performance in 2 mil Au wire bonding is given Table X Examples 38–47. Compositions with 2% glass binder Examples 38–47 have very small number of divots; most of them have zero for divots except Examples 46 and 47 which are based on $Fe_2O_3$ glass.

TABLE IX

Effects of CuO, Cu & Ag, compositions in wt %

| | Example | | | | | | | | | |
|---|---|---|---|---|---|---|---|---|---|---|
| | 38 | 39 | 40 | 41 | 42 | 43 | 44 | 45 | 46 | 47 |
| Au | 83.75 | 83.00 | 83.75 | 83.00 | 83.75 | 83.75 | 84.25 | 84.25 | 83.75 | 83.75 |
| Ag | — | 0.75 | — | 0.75 | — | — | — | — | — | — |
| Cu | — | — | — | — | 0.25 | 0.25 | 0.15 | 0.15 | 0.25 | 0.25 |
| CuO | 0.25 | 0.25 | 0.25 | 0.25 | — | — | — | — | — | — |
| Example 11 | 0.50 | 0.50 | 0.50 | 0.50 | 0.50 | 0.50 | 0.40 | 0.40 | 0.50 | 0.50 |
| Example 4 | 1.50 | 1.50 | — | — | 1.50 | — | 1.20 | — | — | — |
| Example 6 | — | — | 1.50 | 1.50 | — | 1.50 | — | 1.20 | — | — |
| Example 9 | — | — | — | — | — | — | — | — | 1.50 | — |
| Example 10 | — | — | — | — | — | — | — | — | — | 1.50 |
| organics | to 100%→ | | | | | | | | | |

TABLE X

2 Mil. Au Wire Bonding Summary

| Sample | Substrate | Bonds | Misses | FOE's | Divots |
|--------|-----------|-------|--------|-------|--------|
| 38 | Alumina | 224 | 1 | 0 | 0 |
| 38 | 5704 | 224 | 0 | 0 | 0 |
| 39 | Alumina | 224 | 1 | 0 | 0 |
| 39 | 5704 | 224 | 0 | 0 | 0 |
| 40 | Alumina | 224 | 1 | 0 | 0 |
| 40 | 5704 | 224 | 2 | 0 | 0 |
| 41 | Alumina | 224 | 0 | 0 | 0 |
| 41 | 5704 | 224 | 0 | 0 | 0 |

Bond Conditions: 090, 035, 090, 090, 035, 130

| | | | | | |
|---|---|---|---|---|---|
| 42 | Alumina | 224 | 0 | 0 | 0 |
| 42 | 5704 | 224 | 0 | 0 | 0 |
| 43 | Alumina | 224 | 1 | 0 | 0 |
| 43 | 5704 | 224 | 0 | 0 | 0 |

Bond Conditions: 090, 035, 090, 090, 035, 130

| | | | | | |
|---|---|---|---|---|---|
| 44 | Alumina | 224 | 0 | 0 | 8 |
| 44 | 5704 | 224 | 0 | 0 | 38 |
| 45 | Alumina | 224 | 1 | 0 | 3 |
| 45 | 5704 | 224 | 0 | 0 | 12 |
| 46 | Alumina | 224 | 0 | 0 | 0 |
| 46 | 5704 | 224 | 1 | 0 | 45 |
| 47 | Alumina | 224 | 0 | 0 | 1 |
| 47 | 5704 | 224 | 0 | 0 | 10 |

Comparison of Examples 38, 40, and 42 in Table XIII demonstrates the effects of replacing CuO (Examples 38 and 40) by Cu (Examples 42 and 43). Both groups have zero divots on $Al_2O_3$ and 5704. The number of failures is smaller in Cu group (Example 42) and similar in the compositions based on the cobalt glass (Example 40 and 43).

GLOSSARY

Carbitol: Trademark for Union Carbide Corp., Danbury, Conn. for diethylene glycol ethyl ethers.

Texanol: Trademark for Eastman Chemical Products, Inc., Kingsport, Tenn. for 2,2,4-timethylpentanediol-1,3 monoisobutyrate.

Dowanol PPH: Trademark for Dow Chemical Co. for ethylene glycol phenyl ether.

What is claimed is:

1. A composition comprising a glass composition consisting essentially of by mole % 5–70% $Bi_2O_3$, 18–35% $SiO_2$, 0.1–40% CuO, 0.5–25% ZnO, 0.5–40% CoO, 0.5–40% $Fe_2O_3$, and 0.5–40% MnO, wherein the glass composition is free of lead and cadmium.

2. The composition of claim 1 wherein the glass composition consists essentially of by mole % 5–70% $Bi_2O_3$, 20–30% $SiO_2$, 0.2–40% CuO, 2.5–25% ZnO, 1.7–40% CoO, and 10–40% MnO.

3. The composition of claim 1 or 2 further comprising a second glass composition consisting essentially of by mole % (1) 65–85% glass-forming oxides containing 25–55% $B_2O_3$, 40–10% $SiO_2$ and 30–0% other glass forming oxides selected from $Al_2O_3$, $Bi_2O_3$, $ZrO_2$ and mixtures thereof, and (2) 35–15% glass modifying oxides consisting essentially of 3–35% alkaline earth metal oxide(s) of which no more than about 10% is MgO and 0–28% replacement oxide(s) selected from the group consisting of CuO, $Cu_2O$, ZnO and mixtures thereof, of which none exceeds 10% and the total of which does not exceed 80% of the total glass modifying oxides, wherein the second glass composition is free of lead and cadmium.

4. A glass composition consisting essentially of by mole % 0.5–2% MgO, 0–20% BaO, 0–6% $Al_2O_3$, 0–45% $B_2O_3$, 0–5% $ZrO_2$, 18–35% $SiO_2$, 5–70% $Bi_2O_3$, 0–25 ZnO, 0.2–40% CuO, 0.1–40% CoO, 0.5–40% $Fe_2O_3$ and 0–40% MnO, wherein the glass composition is free of lead and cadmium.

5. A glass composition of claim 4 consisting essentially of by mole % 0.7–1.5% MgO, 6–14% BaO, 1.5–4.5% $Al_2O_3$, 15–42% $B_2O_3$, 1.5–4.5% $ZrO_2$, 20–30% $SiO_2$, 5–70% $Bi_2O_3$, 2.5–25 ZnO, 0.2–40% CuO, 17–40% CoO, 1.7–40% $Fe_2O_3$ and 10–40% MnO, which the glass composition is free of lead and cadmium.

6. A thick film paste composition comprising finely divided particles of the glass composition of claim 1, 2, 4 or 5 and electrically conductive particles, all dispersed in an organic medium.

7. The thick film paste composition of claim 6 further comprising copper oxide selected from the formula $CuO_x$ where x ranges from 0–1.

* * * * *